United States Patent
Kim et al.

(10) Patent No.: US 9,837,473 B2
(45) Date of Patent: Dec. 5, 2017

(54) ORGANIC LIGHT EMITTING DIODE DISPLAY

(71) Applicant: LG Display Co., Ltd., Seoul (KR)

(72) Inventors: Hyerin Kim, Cheongju-si (KR); Hoyoung Lee, Paju-si (KR); Jihyeon Yang, Gwangju (KR); Seunghyun Lee, Suwon-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/142,585

(22) Filed: Apr. 29, 2016

(65) Prior Publication Data
US 2016/0322433 A1 Nov. 3, 2016

(30) Foreign Application Priority Data

Apr. 29, 2015 (KR) .................. 10-2015-0060652
Nov. 25, 2015 (KR) .................. 10-2015-0165833

(51) Int. Cl.
*H01L 27/32* (2006.01)

(52) U.S. Cl.
CPC ...... *H01L 27/3218* (2013.01); *H01L 27/3216* (2013.01)

(58) Field of Classification Search
CPC ............ H01L 27/3218; H01L 27/3216; H01L 27/3246; H01L 27/3262; H01L 27/3248; H01L 27/3276
See application file for complete search history.

(56) References Cited

U.S. PATENT DOCUMENTS

| | | | |
|---|---|---|---|
| 2012/0049726 A1* | 3/2012 | Yoo | H01L 27/3213 313/504 |
| 2013/0113363 A1* | 5/2013 | Hong | H01L 27/3218 313/498 |
| 2015/0270317 A1* | 9/2015 | Lee | H01L 27/3218 257/40 |
| 2016/0126295 A1* | 5/2016 | Sato | H01L 27/3218 257/89 |

* cited by examiner

*Primary Examiner* — Roy Potter
*Assistant Examiner* — Paul Patton
(74) *Attorney, Agent, or Firm* — Dentons US LLP

(57) ABSTRACT

Disclosed is an organic light emitting diode display that includes a display panel having a display area that is defined with X and Y axes intersecting each other; and a plurality of pixels in the display panel, each comprising a first sub-pixel, a second sub-pixel and a third sub-pixel, wherein a shape of each of the first, second and third sub-pixels is defined by sides that are at a non-zero angle to the Y-axis or parallel to the X-axis, the first and second sub-pixels are substantially symmetrical to each other with respect to the X-axis, and the third sub-pixel is larger in size than the first and second sub-pixels.

17 Claims, 21 Drawing Sheets

10°  20° 30° 40°   50°   60°

ORGANIC LIGHT EMITTING DIODE DISPLAY

This application claims the priority benefit of Korean Patent Application No. 10-2015-0060652 filed on Apr. 29, 2015 and Korean Patent Application No. 10-2015-0165833 filed on Nov. 25, 2015, which are hereby incorporated herein by reference for all purposes as if fully set forth herein.

BACKGROUND

Field of the Invention

The present invention relates to an organic light emitting diode display and a method of manufacturing the same. More particularly, the present invention relates to an organic light emitting diode display with improved ambient contrast ratio (ACR).

Discussion of the Related Art

Recently, various flat panel displays that are less bulky and lighter than cathode ray tubes (CRTs) are being developed. Examples of the flat panel displays include liquid crystal displays (LCDs), field emission displays (FEDs), plasma display panels (PDPs), electroluminescence devices (ELs), etc.

Organic electroluminescence devices are a self-luminous device, which uses an organic light emitting diode, and offer various advantages including fast response time, high luminous efficiency, high luminance, and wide viewing angle.

FIG. 1 is a diagram illustrating a structure of an organic light emitting diode. The organic light emitting diode comprises an organic electroluminescence compound layer that emits light, and a cathode and anode facing each other, with the organic electroluminescence compound layer sandwiched between them. The organic electroluminescence compound layer typically comprises a hole injection layer HIL, a hole transport layer HTL, an emission layer EML, an electron transport layer ETL, and an electron injection layer EIL.

An exciton is formed through an excitation when a hole and an electron injected into the anode and the cathode recombine at the emission layer EML, and the energy of the exciton causes the organic light emitting diode to emit light. An organic light emitting diode display displays an image by electrically controlling the amount of light generated from the emission layer EML of the organic light emitting diode illustrated in FIG. 1.

Organic light emitting diode displays (OLEDDs), which are electroluminescence devices using the characteristics of the organic light emitting diode, can be classified into passive matrix-type organic light emitting diode displays (PMOLEDs), and active matrix-type organic light emitting diode displays (AMOLEDs).

AMOLEDs display an image by controlling the current flowing through the organic light emitting diode using thin film transistors (hereinafter, "TFTs").

FIG. 2 is an equivalent circuit diagram of a structure of a sub-pixel in an active matrix-type organic light emitting diode display (AMOLED). FIG. 3 is a top plan view illustrating a structure of a sub-pixel in the AMOLED. FIG. 4 is a cross-sectional view of the structure of the AMOLED taken along line I-I' of FIG. 3.

Referring to FIGS. 2 through 4, the AMOLED comprises switching TFTs ST, driving TFTs DT connected to the switching TFTs, and organic light emitting diodes OLED connected to the driving TFTs DT. The TFTs of FIG. 4 are bottom-gate TFTs, but they are not limited thereto and may include other types of TFTs such as top-gate TFTs.

A switching TFT ST is formed at an intersection of a scan line SL and a data line DL. The switching TFT functions to select a sub-pixel. The switching TFT ST comprises a gate electrode SG branched from the scan line SL, a semiconductor layer SA, a source electrode SS, and a drain electrode SD. A driving TFT DT functions to drive the organic light emitting diode OLED of the sub-pixel selected by the switching TFT ST. The driving TFT DT comprises a gate electrode DG connected to the drain electrode SD of the switching TFT ST, a semiconductor layer DA, a source electrode DS connected to a power supply voltage source VDD, and a drain electrode DD. The drain electrode DD of the driving TFT DT is connected to the anode ANO of the organic light emitting diode OLED.

An organic light emitting layer OL is interposed between the anode ANO and the cathode CAT. The cathode CAT is connected to a ground voltage source VSS. An auxiliary storage capacitor Cst is disposed between the gate electrode DG of the driving TFT DT and the power supply voltage source VDD or between the gate electrode DG of the driving TFT DT and the drain electrode DD of the driving TFT DT.

The gate electrodes SG and DG of the switching TFT ST and driving TFT DT are formed on a substrate SUB of the AMOLED. A gate insulating film GI covers the gate electrodes SG and DG. The semiconductor layers SA and DA are formed on part of the gate insulating film GI overlapping the gate electrodes SG and DG. The source electrodes SS and DS and the drain electrodes SD and DD are formed on the semiconductor layers SA and DA, facing each other at a predetermined distance. The drain electrode SD of the switching TFT ST is in contact with the gate electrode DG of the driving TFT DT via a contact hole formed in the gate insulating film GI. The switching TFT ST and driving TFT DT with these structures are covered with a passivation film PAS.

Since many structures are formed on the substrate including the TFTs ST and DT, the surface of the substrate is not flat and has many step portions. The organic light emitting layer OL is beneficially formed on a flat surface to emit light uniformly and evenly. Accordingly, an overcoating layer OC is typically coated over an entire substrate for the purpose of flattening the surface of the substrate.

The anode ANO of the organic light emitting diode OLED is formed on the overcoating layer OC. Here, the anode ANO is connected to the drain electrode DD of the driving TFT DT via a contact hole formed in the overcoating layer OC and the passivation film PAS.

To define a sub-pixel area on the substrate where the anode ANO is formed, a bank BN is formed above the area in which the switching TFT ST, the driving TFT DT, and various wiring lines DL, SL, and VDL are formed. The anode ANO, exposed by the bank BN, becomes a luminous area. The organic light emitting layer OL is formed on the anode ANO exposed by the bank BN. The cathode CAT is formed on the organic light emitting layer OL.

The cathode CAT is formed in such a way as to cover the organic light emitting layer OL and the bank BN, and is deposited along a tapered surface of the bank BN. In order for the cathode CAT to have a good step coverage, an inflection part INF is formed along a curve of the tapered bank BN. The inflection part INF is a part which has a curved shape and is gently stepped.

The AMOLED may be used indoors as well as outdoors. In environments affected by external light sources, ambient contrast ratio is an important factor for the productivity and reliability of the AMOLED. When the AMOLED is used outside, an ambient light 2 from an external light source 1 with an extremely high brightness, such as sunlight, may enter the AMOLED and be reflected by the cathode CAT. The reflected light is then mixed with a self-luminous light 5 generated from the organic light emitting layer OL, which may prevent the user from properly perceiving an image presented by the AMOLED. That is, the AMOLED may have a very low ambient contrast ratio (ACR) depending on the intensity of the ambient light 2 generated from the external light source 1.

Notably, a diffused reflection, but not a specular reflection, may occur when the ambient light 2 from the external light source 1 enters the AMOLED. Diffusely-reflected and scattered rays 4 disturb the self-luminous light 5 generated from the organic light emitting layer OL. The diffuse reflection that disturbs the self-luminous light 5 is mainly due to the inflection part INF at the second electrode CAT formed along the tapered surface of the bank BN.

For instance, FIG. 5 shows a range of diffuse reflection of an ambient light with an incident angle θ1 (see FIG. 4) of 45° off the inflection part INF (see FIG. 4), in the conventional AMOLED. It can be seen that most of the ambient light is reflected at angles θ2 (see FIG. 4) between 40° and 60°, but some scattered rays having angles of reflection θ2 between 10° and 60° exist. Especially, a substantial amount of scattered rays having an angle of reflection θ2 in a range of approximately 30° exists.

In a case where a navigation system is installed in the middle of a vehicle's interior and the user is sitting in the left or right seat, such a scattered light in a range of approximately 30° is within the user's field of vision. Thus, an ambient light coming from the sides at 45° is diffusely reflected within the user's field of vision. The diffusely-reflected and scattered light further decreases the ambient contrast ratio of the AMOLED, thus making it difficult to produce vivid images and resulting in low productivity and reliability.

Typically, a polarizer, antireflective films, etc. with low reflectivity and high transmittance have been used as one of the solutions to the above-described problem. Although the polarizer, antireflective films, etc. can improve ambient contrast ratio, they may reduce the transmittance of the self-luminous light emitted by the organic light emitting layer, thereby leading to a decrease in the luminance of the display device and higher power consumption. Moreover, the application of a polarizer with low reflectivity may increase manufacturing costs and require an additional process with an additional processing time.

SUMMARY

Accordingly, the present invention is directed to an organic light emitting diode display and a method of manufacturing the same that substantially obviate one or more problems due to limitations and disadvantages of the related art.

An advantage of the present invention is to provide an organic light emitting diode display with improved ambient contrast ratio.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting diode display may, for example, include a display panel having a display area that is defined with X and Y axes intersecting each other; and a plurality of pixels in the display panel, each comprising a first sub-pixel, a second sub-pixel and a third sub-pixel, wherein a shape of each of the first, second and third sub-pixels is defined by sides that are at a non-zero angle to the Y-axis or parallel to the X-axis, the first and second sub-pixels are substantially symmetrical to each other with respect to the X-axis, and the third sub-pixel is larger in size than the first and second sub-pixels.

In another aspect of the present invention, an organic light emitting diode display may, for example, include a plurality of scan lines arranged along an X-axis; a plurality of data lines arranged along a Y-axis crossing the X-axis; first, second, and third regions arranged in a matrix defined by crossings of the scan lines and the data lines; thin film transistors arranged in the first, second and third regions; first electrodes connected to the thin film transistors via pixel contact holes; and banks on the first electrodes to define first, second, and third sub-pixels, wherein a shape of each of the first, second, and third sub-pixels is defined by sides that are at a non-zero angle to the Y-axis or parallel to the X-axis, the first and second sub-pixels are substantially symmetrical to each other with respect to the X-axis, and the third sub-pixel is larger in size than the first and second sub-pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
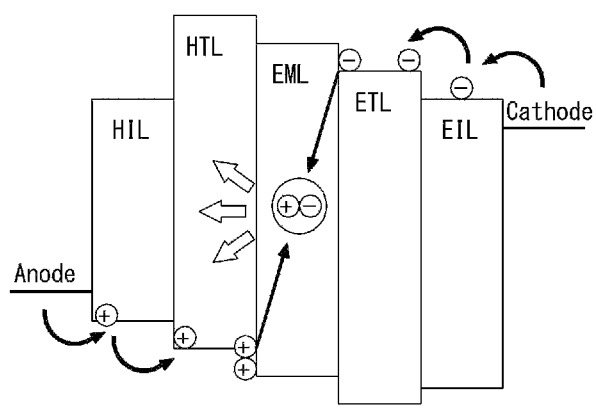
FIG. 1 is a view illustrating an organic light emitting diode according to the related art.
Figure 2:
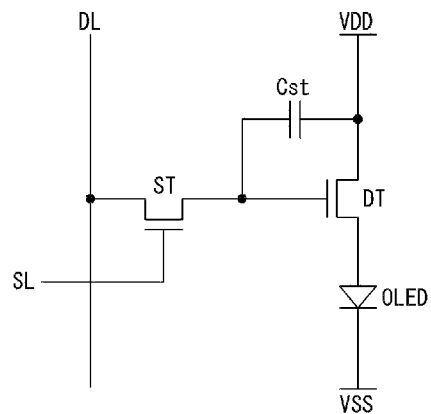
FIG. 2 is an equivalent circuit diagram illustrating a structure of a sub-pixel in an active matrix-type organic light emitting diode display according to the related art.
Figure 3:
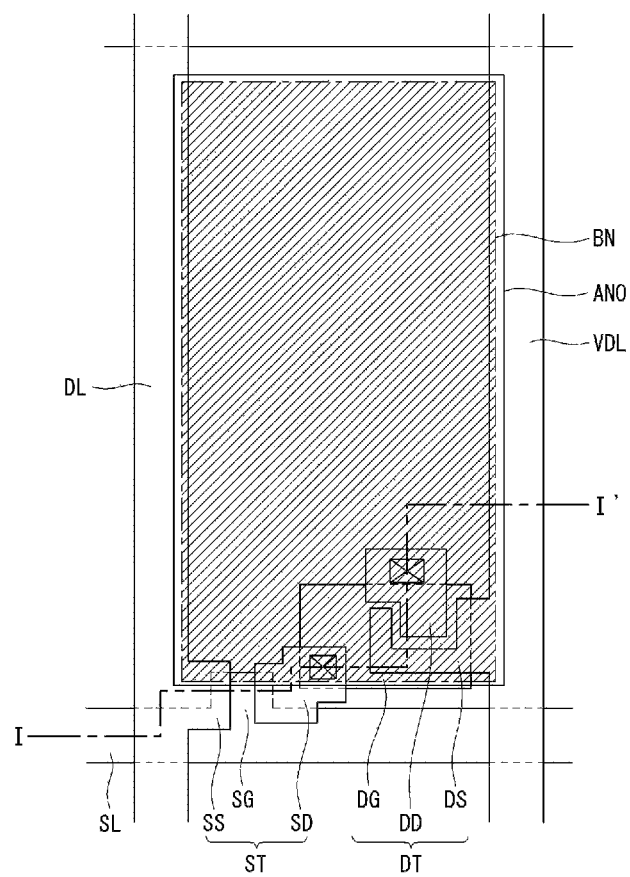
FIG. 3 is a top plan view illustrating a structure of a sub-pixel in the active matrix-type organic light emitting diode display according to the related art.
Figure 4:
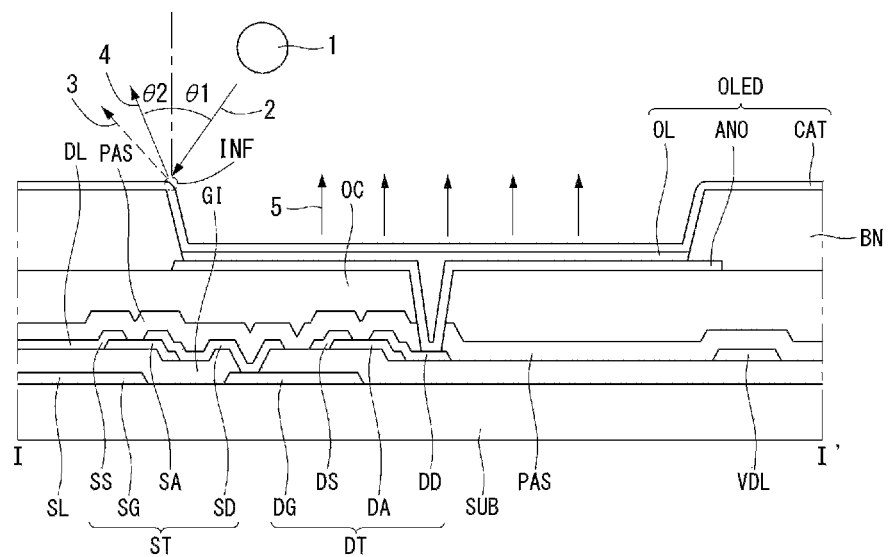
FIG. 4 is a cross-sectional view illustrating a structure of the active matrix-type organic light emitting diode display taken along line I-I' of FIG. 3.
Figure 5:
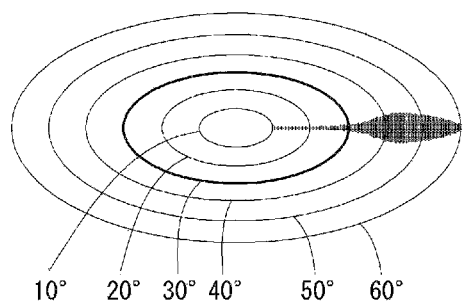
FIG. 5 is a graph showing a range of diffuse reflection of an ambient light off an inflection part in an organic light emitting diode display according to the related art.

Reference will now be made in detail to embodiments illustrated in the accompanying drawings. Wherever possible, the same reference numbers are used in the drawings and the description to refer to the same or like parts. A detailed description of known arts will be omitted if it is determined that the arts can mislead the embodiments of the invention. In describing various embodiments, descriptions of the same or like parts will be given with respect to a first exemplary embodiment and omitted in other exemplary embodiments.

Although terms including ordinal numbers such as first and second may be used to describe various components, the components are not limited by the terms. The terms are used only to distinguish one component from other components.

When a component is described as being "linked" or "connected" to another component, a component may be directly linked or connected to another component, it should be understood, however, that another component may be present in the middle. Meanwhile, when a component is described as being "directly linked" or "directly connected" to another component, it should be understood that another component may not be present in the middle.

Figure 6:
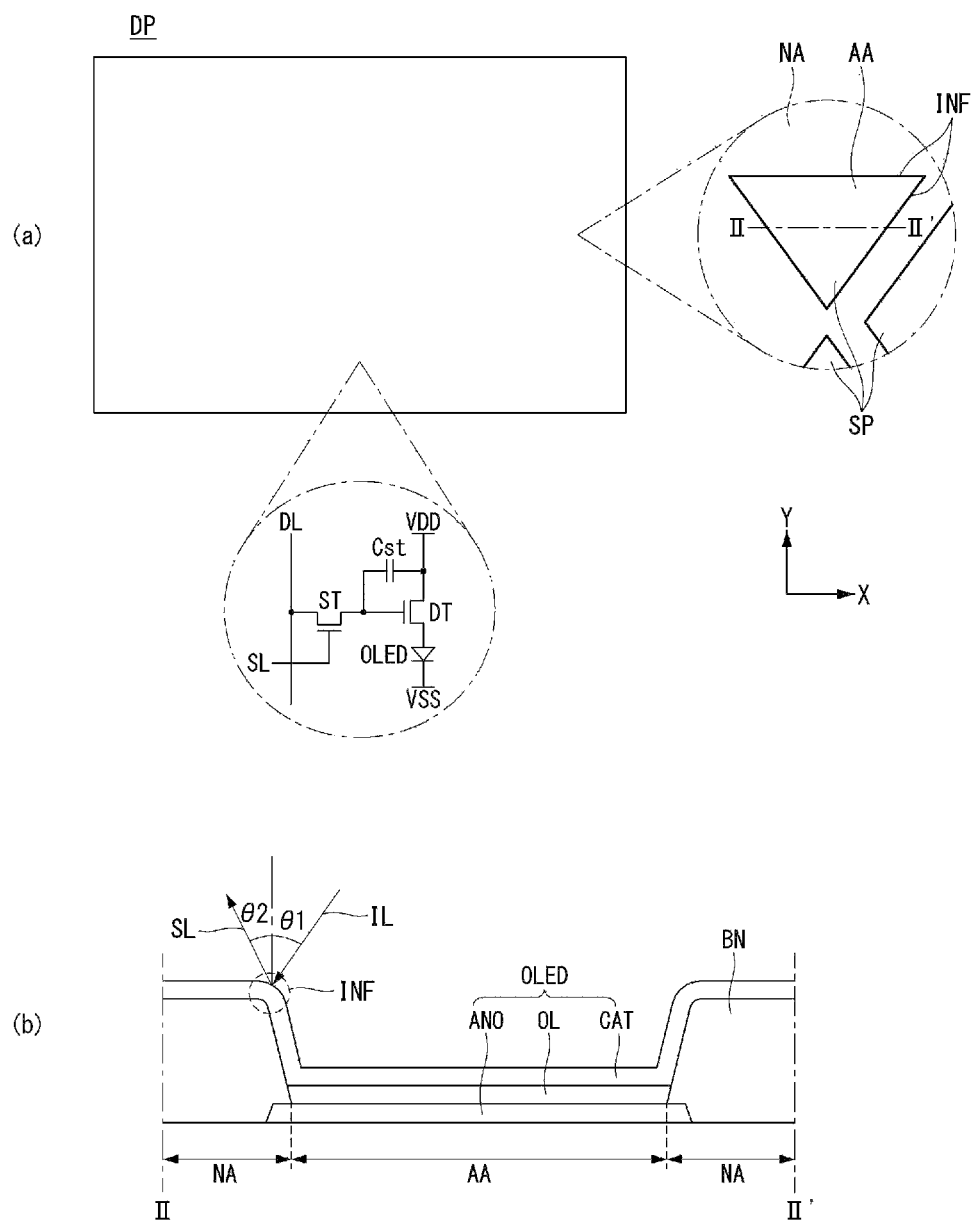
FIG. 6 is a view illustrating an example of a display panel DP of an organic light emitting diode display.

FIG. 6 is a view illustrating an exemplary display panel DP of an organic light emitting diode display.

Referring to FIG. 6, the display panel DP may have various shapes, for example, planar shapes such as a square shape, a rectangular shape, a circular shape, etc. X- and Y-axes intersecting each other are defined on the display panel DP, regardless of the shape of the display panel DP. The shapes of sub-pixels to be described later may be defined by the X- and Y-axes.

The display panel DP comprises a substrate, thin film transistors ST and DT formed on the substrate, and organic light emitting diodes OLEDs formed at the thin film transistors ST and DT.

The thin film transistors ST and DT comprise switching thin film transistors ST and driving thin film transistors DT. Each switching thin film transistor ST is formed at an intersection between a scan line SL and a data line DL, and functions to select a sub-pixel SP. The sub-pixel SP is the smallest unit of an image. Each driving thin film transistor DT functions to drive the organic light emitting diode OLED of the sub-pixel SP selected by the switching thin film transistor ST.

The organic light emitting diode OLED comprises a first electrode ANO connected to the driving thin film transistor DT, a second electrode CAT facing the first electrode ANO, and an organic light emitting layer OL interposed between the first electrode ANO and the second electrode CAT. The first electrode ANO may be an anode, and the second electrode CAT may be a cathode.

To define a sub-pixel area on the first electrode ANO, a bank BN is formed above the area in which the switching TFT ST, driving TFT DT, scan line SL, and data line DL are formed. The area covered with the bank BN is defined as a non-luminous area NA, and the area without the bank BN is defined as a luminous area AA. The luminous area AA defined by the bank BN corresponds to a shape of a sub-pixel SP. That is, the bank BN may be formed in such a way that each sub-pixel SP has a predetermined shape. The organic emissive layer OL is formed in the luminous area AA, and the second electrode CAT is formed on the organic emissive layer OL.

The second electrode CAT is formed to cover the organic emissive layer OL and the bank BN, and deposited along a tapered surface of the bank BN. In order for the cathode CAT to have a good step coverage, an inflection part INF is formed along a curve of the tapered bank BN. The inflection part INF is a part which has a curved shape and is gently stepped.

With this structure, an ambient light IL incident at a particular angle on the inflection part INF from an external light source is diffusely reflected. A diffusely-reflected, scattered light SL may be perceived by a user positioned at a particular angle. This may decrease the ambient contrast ratio of the organic light emitting diode display. To address this problem, an organic light emitting diode display according to an embodiment of the present invention changes a direction of the scattered light SL incident at a particular angle and scattered by the inflection part INF by varying a shape of the sub-pixel SP. With such a change in direction, the scattered light SL can travel outside the user's field of vision, and the diffusely-reflected, scattered light SL can be reduced or prevented from being mixed with the self-luminous light emitted from the organic emissive layer OL, thereby enhancing the ambient contrast ratio.

Hereinafter, embodiments of the present invention will be described in detail with reference to the accompanying drawings.

Figure 7:
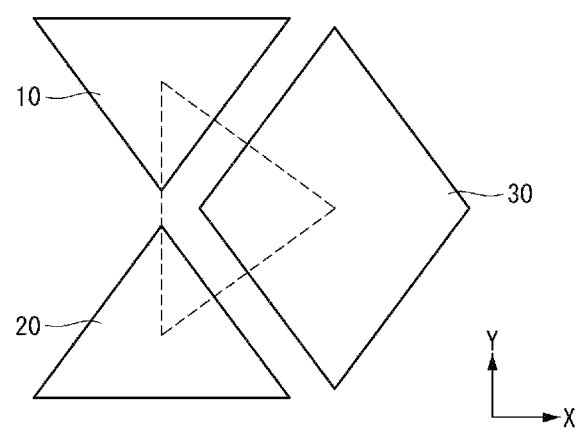
FIG. 7 is a view illustrating an arrangement and a shape of sub-pixels of an organic light emitting diode display according to an embodiment of the present invention.

FIG. 7 is a view illustrating an arrangement and shape of sub-pixels of an organic light emitting diode display according to an embodiment of the present invention.

Referring to FIG. 7, a display panel DP comprises a plurality of pixels. Each pixel comprises a first sub-pixel 10, a second sub-pixel 20, and a third sub-pixel 30. The first sub-pixel 10, second sub-pixel 20, and third sub-pixel 30 are arranged in a delta structure, as indicated by the dotted line.

The shape of each sub-pixel 10, 20, and 30 is such that any sides of each sub-pixel 10, 20, and 30 are not parallel to the Y-axis. That is, the shape of each of the first, second, and third sub-pixels 10, 20, and 30 may comprise at least three sides, and each side may be at an angle with respect to the Y-axis or parallel to the X-axis.

Figure 8:
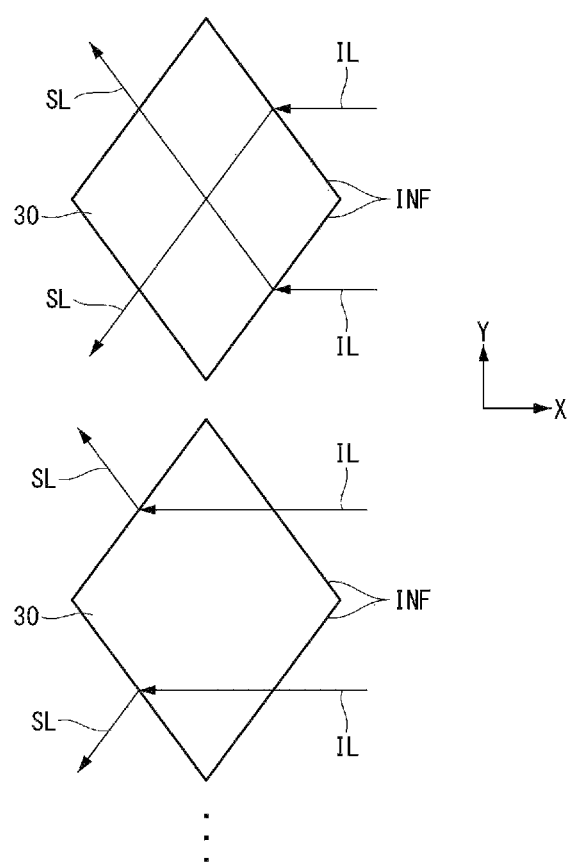
FIGS. 8 through 11 are views for explaining effects of an organic light emitting diode according to an embodiment of the present invention.

Referring to FIG. 8, in the organic light emitting diode display according to an embodiment of the present invention, the sides of each of the sub-pixels 10, 20, and 30 are not parallel to the Y-axis. Thus, even if an ambient light IL coming from outside is diffusely reflected off the inflection part IN formed along the shape of each of the sub-pixels 10, 20, and 30, a direction of the diffusely-reflected, scattered light can change. With such a change in direction, the scattered light SL can travel outside the user's field of vision, and the diffusely-reflected, scattered light SL can be reduced or prevented from being mixed with the self-luminous light emitted from the organic emissive layer OL (see FIG. 6), thereby enhancing the ambient contrast ratio.

Figure 9:
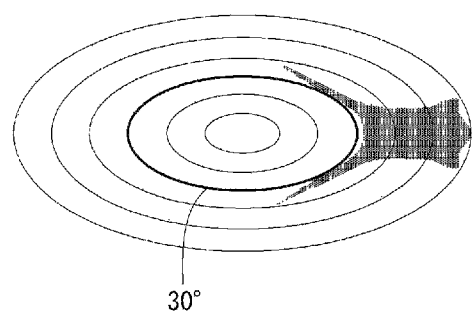

For instance, FIG. 9 shows a range of diffuse reflection of an ambient light with an incident angle θ1 (see FIG. 6) of 45° off the inflection part INF (see FIG. 6), in the organic light emitting diode display according to an embodiment of the present invention. Part of the diffusely-reflected, scattered light SL has a reflection angle range of 30°. However, the scattered light SL in the 30° range is not within the user's field of vision. Specifically, the sides of the sub-pixels 10, 20, and 30 are not parallel to the Y-axis; thus, the scattered light SL diffusedly reflected in the 30° range is scattered upward or downward, out of the user's field of vision, and may not come directly into the field of vision.

That is, in the above-described related art, the user may not properly perceive an image presented by the organic light emitting diode display because the scattered light SL in the 30° range is within the user's field of vision. On the contrary, the organic light emitting diode display according to an embodiment of the present invention can improve the ambient contrast ratio by reducing or preventing the scattered light SL in the 30° range from directly coming into the user's field of vision.

Figure 10:
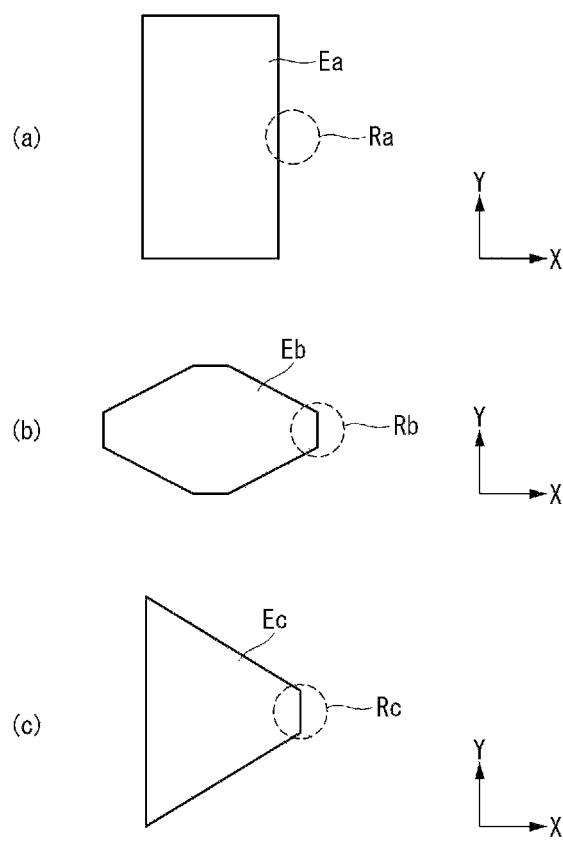

As described above, the first, second, and third sub-pixels 10, 20, and 30 of the organic light emitting diode display according to an embodiment of the present invention may have various shapes. However, as illustrated in FIG. 10, their sides Ra, Rb, and Rc are beneficially not parallel to the Y-axis in order for the organic light emitting diode display to have a higher ambient contrast ratio by changing the direction of the scattered light that is diffusely reflected off the inflection part, as described above.

Figure 11:
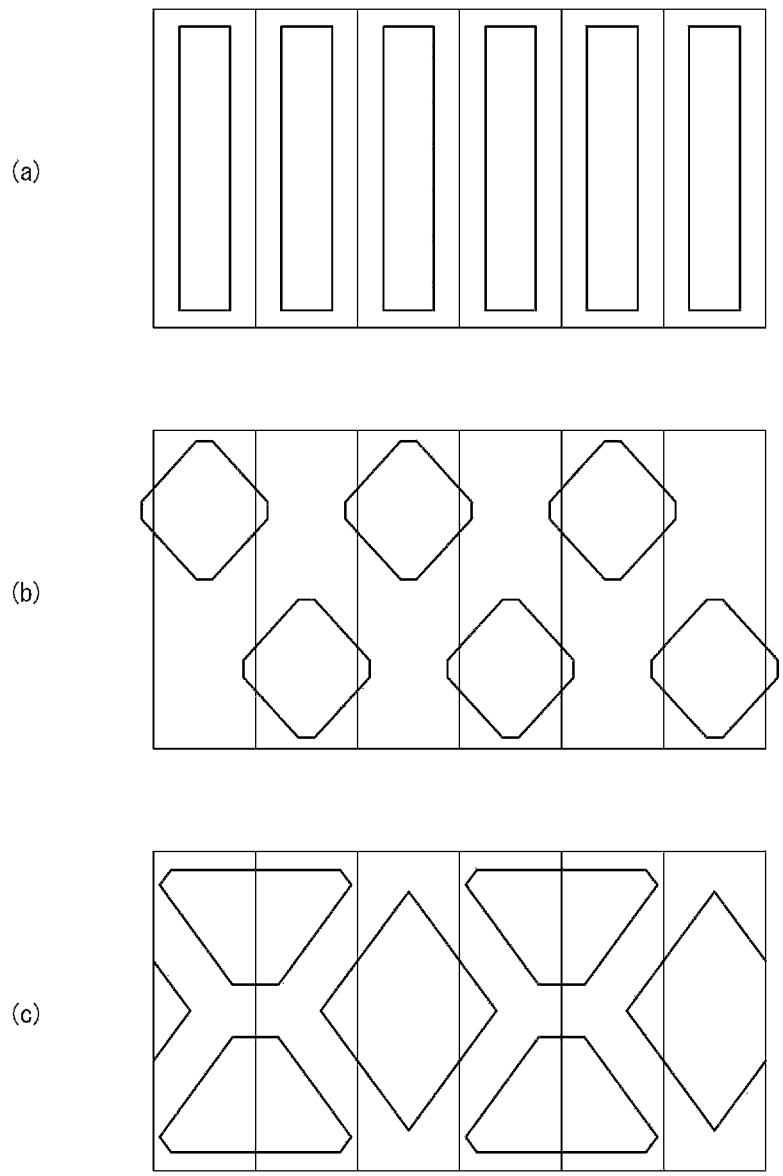

FIG. 11 illustrate various examples of a sub-pixel structure such as a stripe-shaped sub-pixel structure, a diamond-shaped sub-pixel structure and a sub-pixel structure with a delta arrangement. A test was performed to measure the luminance of an ambient light with an incident angle of 45° that is diffusely reflected off the inflection part in the 30° range. The luminance of the ambient light incident at 45° was 400,000 nit.

In the stripe-shaped sub-pixel structure illustrated in (a) of FIG. 11, the luminance of the light diffusely reflected in the 30° range was about 155 nit. In the diamond-shaped sub-pixel structure illustrated in (b) of FIG. 11, the luminance of the light diffusely reflected in the 30° range was about 71.6 nit. In the sub-pixel structure with a delta arrangement according to an embodiment of the present invention illustrated in (c) of FIG. 11, the luminance of the light diffusely reflected in the 30° range was about 19 nit. From these test results, it can be concluded that the sub-pixel structure with a delta arrangement according to an embodiment of the present invention has favorably a lower luminance of the light diffusely reflected in the 30° range as compared to the stripe-shaped sub-pixel structure and the diamond-shaped sub-pixel structure.

Figure 12:
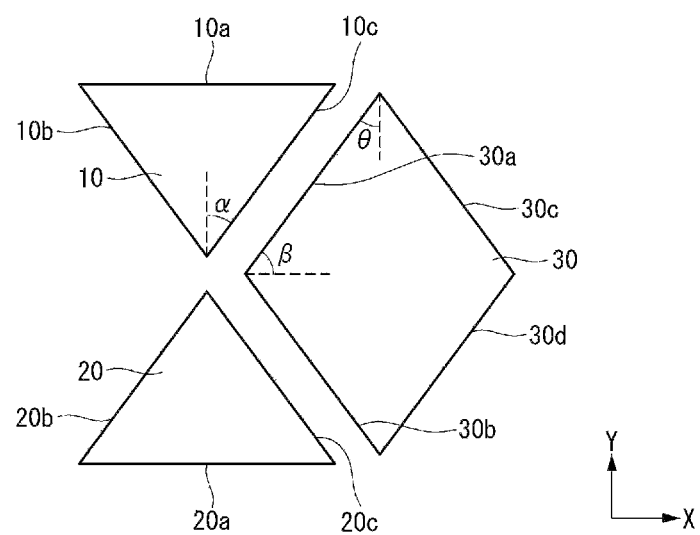
FIGS. 12 and 13 are views illustrating an organic light emitting diode display according to the first exemplary embodiment of the present invention.
Figure 13:
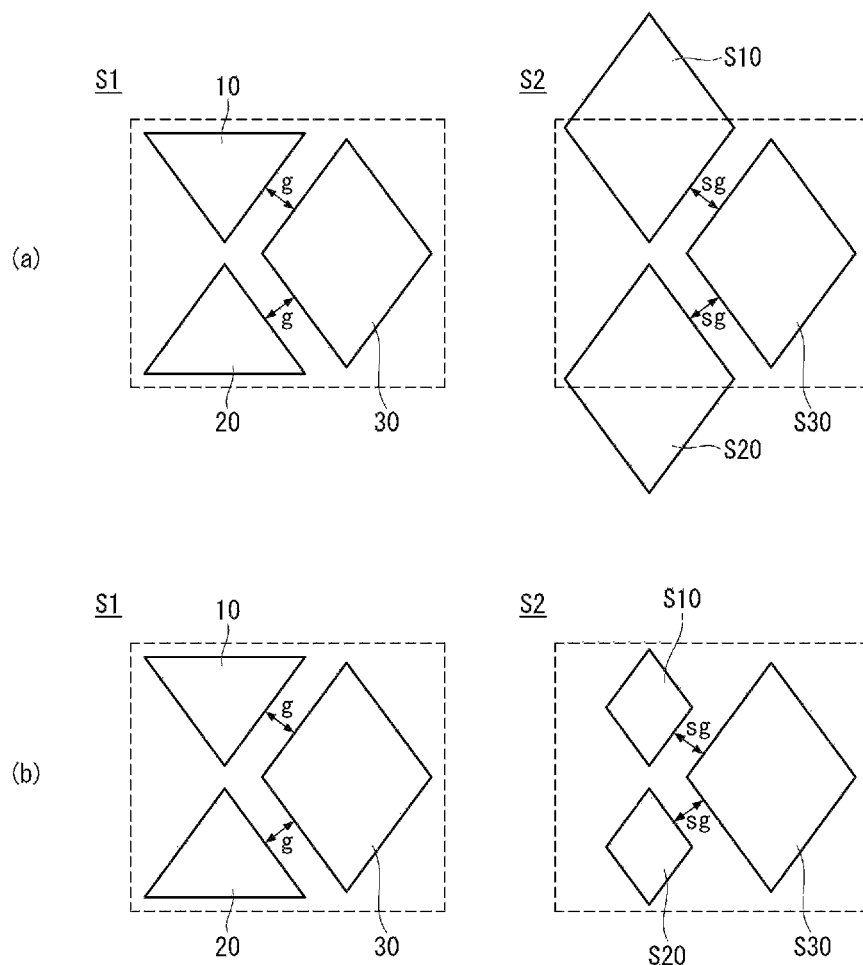

FIGS. 12 and 13 are views for explaining an organic light emitting diode display according to the first exemplary embodiment of the present invention.

Referring to FIG. 12, the organic light emitting diode display according to the first exemplary embodiment of the present invention may comprise a first sub-pixel 10, a second sub-pixel 20 symmetrical to the first sub-pixel 10 with respect to the X-axis, and a third sub-pixel 30 being larger in size than each of the first and second sub-pixels 10 and 20.

The first sub-pixel 10 is in the shape of a triangle with three sides. That is, the first sub-pixel 10 may have a first side 10a parallel to the X-axis, a second side 10b bent and extended from one end of the first side 10a, and a third side 10c bent and extended from the other end of the first side 10a and connected to the second side 10b. The angle between the first side 10a and the second side 10b and the angle between the first side 10a and the third side 10c may be equal.

The second sub-pixel 20 is in the shape of a triangle with three sides. That is, the second sub-pixel 20 may have a fourth side 20a parallel to the X-axis, a fifth side 20b bent and extended from one end of the fourth side 20a, and a sixth side 20c bent and extended from the other end of the fourth side 20a and connected to the fifth side 20b. The angle between the fourth side 20a and the fifth side 20b and the angle between the fourth side 20a and the sixth side 20c may be equal. The first and second sub-pixels 10 and 20 may be symmetrical with respect to the X-axis.

The third sub-pixel 30 is in the shape of a rectangle or rhombus with four sides. That is, the third sub-pixel 30 may have a seventh side 30a making an acute angle θ with the Y-axis, an eighth side 30b bent and extended from one end of the seventh side 30a and vertically symmetrical to the seventh side 30a about the X-axis, a ninth side 30c bent and extended from the other end of the seventh side 30a and parallel to the eighth side 30b, and a tenth side 30d connected to the eighth side 30b and the ninth side 30c and parallel to the seventh side 30a.

The seventh side 30a of the third sub-pixel 30 may be parallel to the third side 10a, which is the closest to the third sub-pixel 30 among the sides of the first sub-pixel 10. The eighth side 30b of the third sub-pixel 30 may be parallel to the sixth side 20c, which is the closest to the third sub-pixel 30 among the sides of the second sub-pixel 20. The area between the third side 10c and the seventh side 30a and the area between the sixth side 20c and the eighth side 30b may be separated from each other with a minimum distance in consideration of process margin.

An aspect according to an embodiment of the present invention is to reduce or minimize an amount of diffusely-reflected, scattered light that comes into the user's field of vision, while maintaining the same aperture ratio, as compared to the conventional stripe-shaped sub-pixel structure.

Another aspect according to an embodiment of the present invention is to design a sub-pixel structure with a shape that makes it easy to use a fine metal mask (FMM) process, which is generally used to form an organic emissive layer. In the FMM process, an opening is formed by longitudinally extending a mask with a hole. Organic light emitting materials are deposited onto their corresponding sub-pixels, respectively, through the longitudinally extended openings. It may be difficult to laterally extend the mask because of the limits and costs of the process technology. For this reason, as the openings become more laterally extended, it becomes more difficult to apply the FMM process.

Taking this problem into consideration and assuming that the third side 10c is parallel to the seventh side 30a and the sixth side 20c is parallel to the eighth side 30b and they are separated by a minimum distance in consideration of process margin, the acute angle β between the seventh side 30a of the third sub-pixel 30 and the X-axis may range from 40° to 50°. In this instance, the acute angle α between the third side 10c of the first sub-pixel 10 parallel to the seventh side 30a and the X-axis is (90°-β) may range from 40° to 50°. If the acute angle α is less than 40°, the diffusely-reflected scattered light is more likely to come into the user's field of vision, and if the acute angle α is larger than 50°, it becomes more difficult to apply the FMM process.

In the organic light emitting diode display according to the first exemplary embodiment of the present invention, organic light emitting materials of different colors may be applied to sub-pixels 10, 20, and 30 of different sizes in consideration of the lifetimes of the organic light emitting materials to improve the overall lifetime of the organic light emitting diode display.

Specifically, the organic light emitting materials applied to the sub-pixels 10, 20, and 30 to form organic emissive layers of different colors may differ in lifetime. In the organic light emitting diode display according to the first exemplary embodiment of the present invention, the third sub-pixel 30 is larger in size than the first and second sub-pixels 10 and 20. Thus, an organic light emitting material of a color with a shorter lifetime may be applied to the third sub-pixel 30. For example, a blue organic light emitting material, which typically has a shorter lifetime than red and green organic light emitting materials, may be applied to the third sub-pixel 30 having a larger size, and the red and green organic light emitting materials may be applied to the first and second sub-pixels 10 and 20, respectively or vice versa. Accordingly, the organic light emitting diode display according to the first exemplary embodiment of the present invention can reduce or prevent a decrease in the overall lifetime of the organic light emitting diode display, why may be caused by differences in lifetime between organic light emitting materials applied to different sub-pixels.

Moreover, the organic light emitting diode display according to the first exemplary embodiment of the present invention can achieve a high resolution and a high aperture ratio. FIG. 13 illustrates first and second pixel structures S1 and S2 according to the first exemplary embodiment of the present invention and a comparative example, respectively.

Referring to FIG. 13, the first structure S1 is a pixel structure according to the first exemplary embodiment of the present invention. The second structure S2 is a pixel structure, in which all the sub-pixels are rectangular like the third sub-pixel 30 of this invention. The dotted lines illustrated in the drawing are virtual lines defining the same area, by which the difference in area between the first and second structures S1 and S2 can be seen.

In the first and second structures S1 and S2, due to process margin, one side of the first sub-pixels 10 and S10 is beneficially separated from one side of the adjacent third sub-pixels 30 and S30, and one side of the second sub-pixels 20 and S20 is beneficially separated from one side of the adjacent third sub-pixels 30 and S30. Assuming that these separation distances g and sg are equal, the size of a pixel comprising the first, second, and third sub-pixels S10, S20, and S30 in the second structure S2 is larger than the size of a pixel comprising the first, second, and third sub-pixels 10, 20, and 30 in the first structure S1 (see (a) of FIG. 13). In this case, the number of pixels on the display panel may vary even if the area of the display panel is the same, and this may result in a difference in resolution. In other words, even if the area of the display panel is the same, the second structure S2 with a larger pixel size has a lower resolution than the first structure S1. As a result, the first exemplary embodiment of the present invention can achieve a high resolution by properly arranging the triangular first and second sub-pixels 10 and 20 and the rectangular third sub-pixel 30, which are different in size.

To make the size of the pixel in the second structure S2 the same as that of the pixel in the first structure S1, the size of the sub-pixels S10 and S20 in the pixel of the second structure S2 may be reduced. With this reduction in the size of the sub-pixels S10 and S20 in the pixel of the second structure S2, the aperture ratio is, however, significantly decreased (see (b) of FIG. 13). The second structure S2 may allow for a high aperture ratio if one pixel is constituted with two sub-pixels (the so-called PenTile structure), but may significantly decrease the aperture ratio if one pixel is constituted with three sub-pixels. With a proper arrangement of the triangular first and second sub-pixels 10 and 20 and the rectangular third sub-pixel 30, the first exemplary embodiment of the present invention allows for a high aperture ratio for a pixel constituted with three or more sub-pixels.

Figure 14:
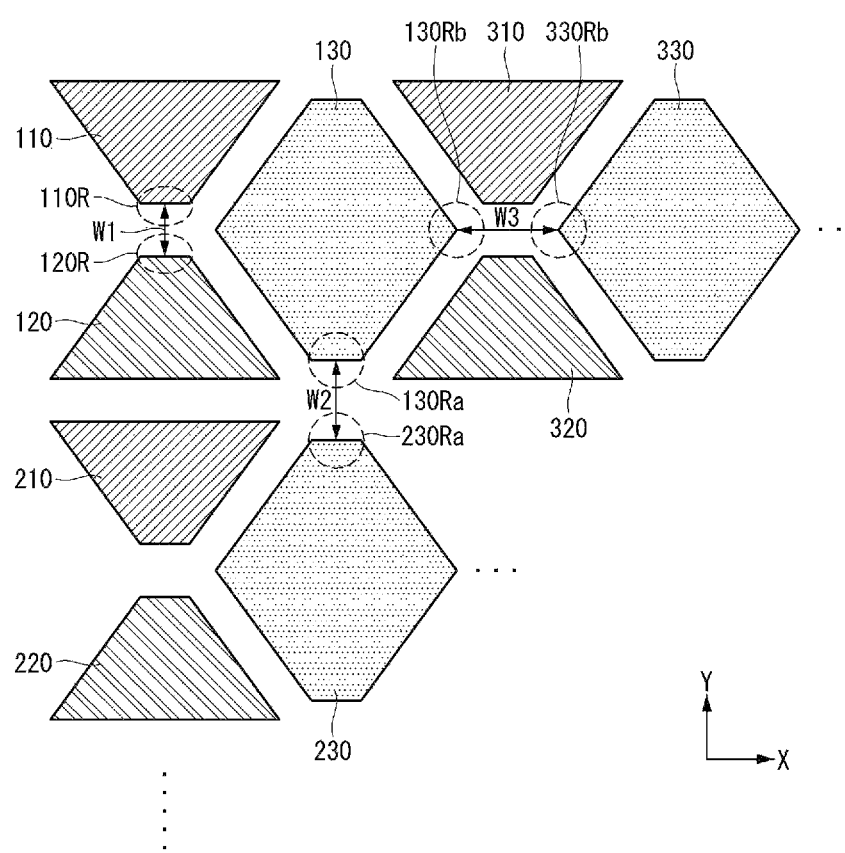
FIG. 14 is a view illustrating an organic light emitting diode display according to the second exemplary embodiment of the present invention.

FIG. 14 is a view illustrating an organic light emitting diode display according to the second exemplary embodiment of the present invention.

Referring to FIG. 14, the organic light emitting diode display according to the second exemplary embodiment of the present invention has sub-pixels 110, 120, and 130 having the same shapes as the sub-pixels 10, 20, and 30 illustrated in FIG. 12, and one or more corners of one or more of the sub-pixels 110, 120, and 130 are chamfered. That is, the first sub-pixel 110 and the second sub-pixel 120 may have the shape of a chamfered triangle, and the third sub-pixel 130 may have the shape of a chamfered rectangle.

A chamfered shape refers to a shape made by cutting off a vertex. As illustrated in FIG. 14, each side of any sub-pixel having a chamfered shape in the organic light emitting diode display according to the second embodiment of the present invention is not parallel to the Y-axis.

The organic light emitting diode display according to the second exemplary embodiment of the present invention may provide a higher reliability in the deposition of organic light emitting materials onto different sub-pixels using the FMM process.

In a typical method of depositing organic light emitting materials using the FMM process, a first organic light emitting material is deposited onto first sub-pixels 110, 210, and 310 representing a first color, and then a second organic light emitting material is deposited onto second sub-pixels 120, 220, and 320 representing a second color by using another FMM process. In this case, if the first and second sub-pixels 110 and 120, where organic light emitting materials of different colors are deposited, are positioned adjacent to each other, the two different color materials may be mixed. For example, if the first sub-pixel 110 and the second sub-pixel 120 are positioned adjacent to each other, the first organic light emitting material may be deposited onto the second sub-pixel 120, even with a slight shift in the position of the FMM process during which the first organic light emitting material is deposited onto the first sub-pixel 110, leading to a mixture of the two different color materials.

To address this, the adjacent first and second sub-pixels 110 and 120 are beneficially separated by a predetermined distance W1 by chamfering a part 110R of the first sub-pixel 110 and a part 120R of the second sub-pixel 120. It should be appreciated that only one of the adjacent first and second sub-pixels 110 and 120 can be chamfered to separate them from each other. By doing so, the organic light emitting diode display according to the second exemplary embodiment of the present invention can deliver a higher deposition reliability.

One FMM comprises an opening portion and a non-opening portion. An organic light emitting material is deposited onto a designated sub-pixel through the opening portion. The opening portion functions as a path through which an organic light emitting material is deposited onto a designated sub-pixel. The non-opening portion functions as a barrier that prevents an organic light emitting material from being deposited onto an undesignated sub-pixel.

If sub-pixels of the same color are positioned adjacent to each other, as is the case with the third sub-pixel 130 and the third sub-pixel 230 of adjacent pixels, the non-opening portion of the FMM for depositing a third organic light emitting material onto the third sub-pixels 130 and 230 has a small width. Because of its thin thickness, the FMM may be easily deformed at a position where it has a small width, and such a deformation of the FMM may disturb accurate deposition of an organic light emitting material onto a designated sub-pixel.

In the case of the third sub-pixels 130 and 230 vertically adjacent to each other and separated by a small distance, they may be further separated by a larger distance W2 by chamfering parts 130Ra and 230Ra of the adjacent sub-pixels 130 and 230, as illustrated in FIG. 14. However, in the case of the third sub-pixels 130 and 330 laterally adjacent to each other and separated by a large distance W3, parts 130Rb and 230Rb of the adjacent sub-pixels 130 and 330 may not require chamfering. That is, one or more of the sub-pixels 110, 120, 130, 210, 220, 230, 310, 320, and 330 may have a chamfered sub-pixel shape, if desired, so that the non-opening portion of the FMM has sufficient width depending on the separation distance. By do so, the organic light emitting diode display according to the second exemplary embodiment of the present invention may deliver a higher deposition reliability.

Figure 15:
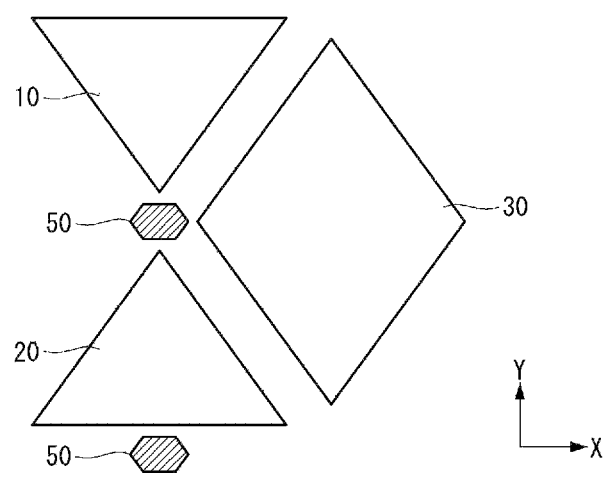
FIG. 15 is a view illustrating an organic light emitting diode display according to the third exemplary embodiment of the present invention.

FIG. 15 is a view illustrating an organic light emitting diode display according to the third exemplary embodiment of the present invention.

Referring to FIG. 15, the organic light emitting diode display according to the third exemplary embodiment of the present invention further comprises a spacer 50, in addition to the elements of the organic light emitting diode displays according to the first and second exemplary embodiments of the present invention.

When forming an organic emissive layer using an FMM, the spacer 50 serves to support the FMM so that the FMM may not come into contact with the substrate. Also, the spacer 50 serves to protect the substrate. That is, the spacer 50 may be formed between sub-pixels 10, 20, and 30 to reduce or prevent a physical damage to the substrate due to an external impact, etc. The spacer 50 may be disposed in at least one of the areas between the sub-pixels 10, 20, and 30. The spacer 50 may be separated from the sub-pixels 10, 20, and 30 by a predetermined distance.

The spacer 50 may have various planar shapes such as a triangle, a rectangle, etc. In this case, the shape of the spacer 50 is such that the sides are beneficially not parallel to the Y-axis. That is, each side of the shape of the spacer 50 is at an angle to the Y-axis or parallel to the X-axis. As a result, the third exemplary embodiment of the present invention may provide the same or similar advantages as the above-described the first and second exemplary embodiment of the present invention.

That is, a second electrode may be formed on the spacer 50 as well. The second electrode is deposited along a tapered surface of the spacer 50. In this case, an inflection part may be formed along a curve of the spacer 50. Since each side of the spacer 50 is not parallel to the Y-axis, the spacer 50 according to the third exemplary embodiment of the present invention can reduce or minimize the range of scattered light, which is incident at a particular angle and reflected through the inflection part formed along each side of the spacer 50, that comes into the user's field of vision. Accordingly, the organic light emitting diode display according to the third exemplary embodiment of the present invention can further improve the ambient contrast ratio.

Figure 16A:
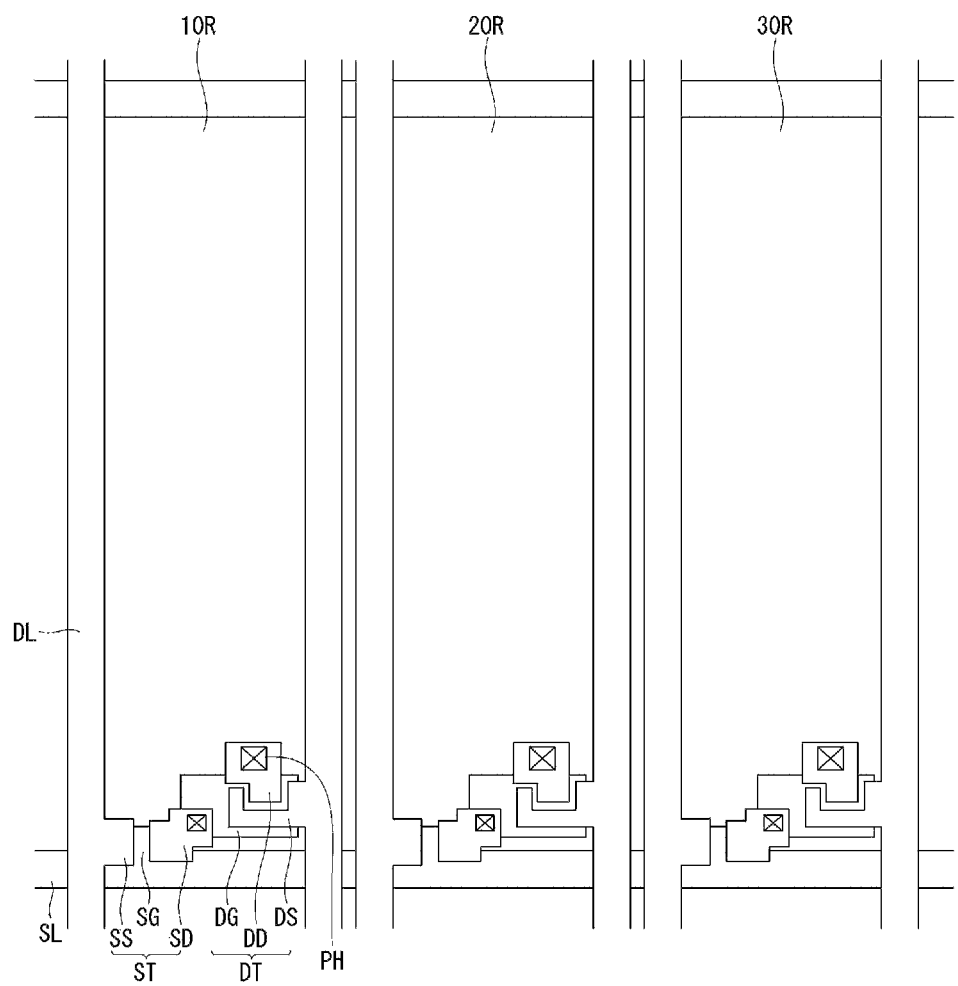
FIGS. 16A to 16C are views illustrating an exemplary configuration of elements in an organic light emitting diode display according to an embodiment of the present invention.
Figure 16B:
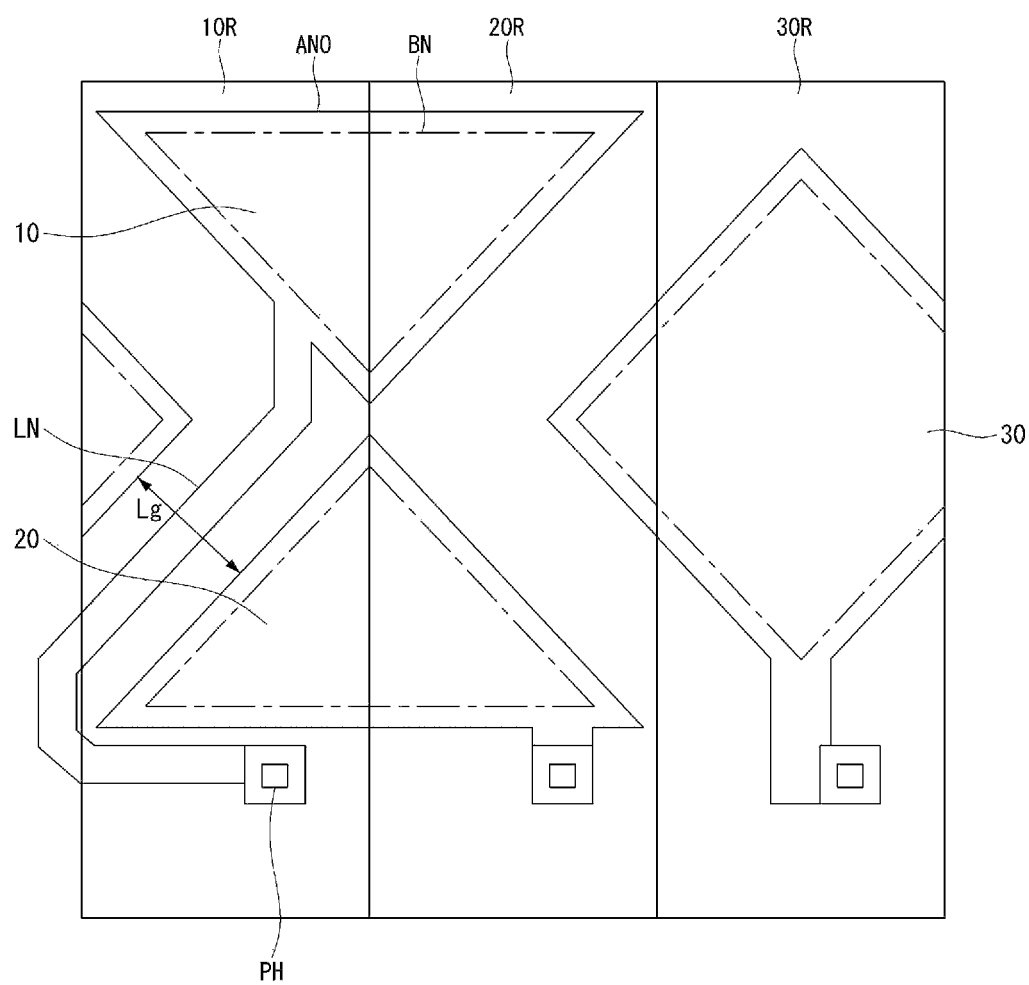
Figure 16C:
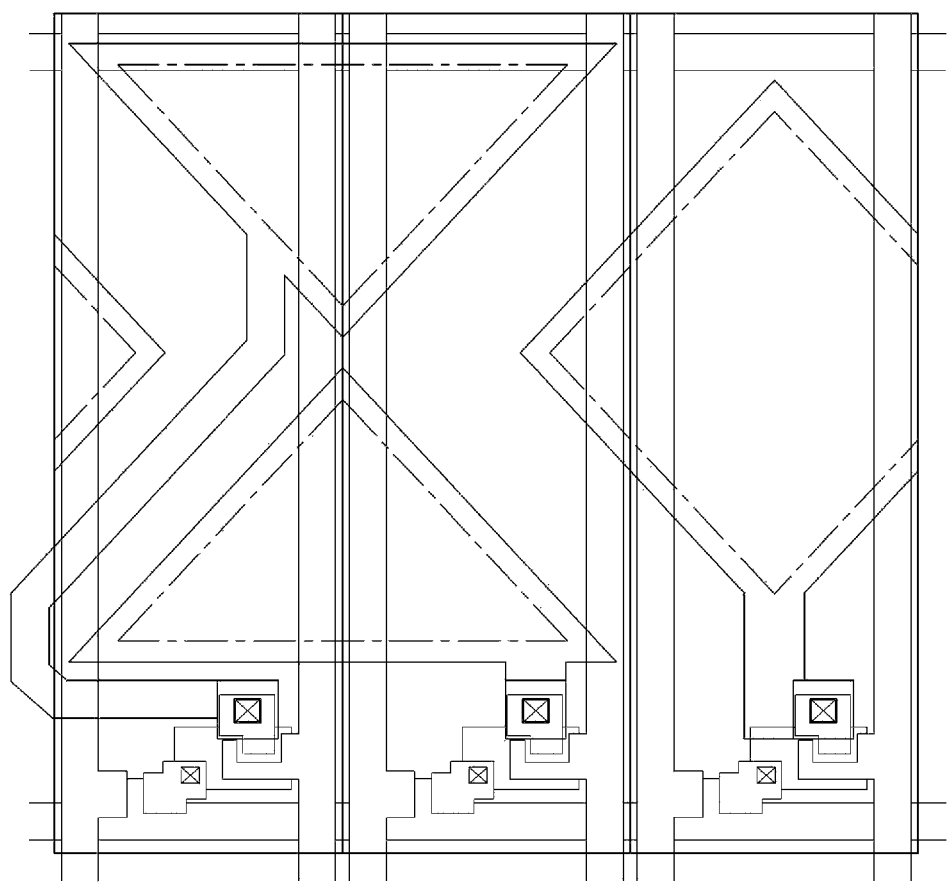

FIGS. 16A through 16C illustrate an exemplary configuration of elements in an organic light emitting diode display according to an embodiments of the present invention. For convenience of explanation, the shapes of sub-pixels of the organic light emitting diode display will be described with the shapes of sub-pixels of the first exemplary embodiment by way of example.

FIG. 16A is a view illustrating the positions of thin film transistors and pixel contact holes for connecting the thin film transistors and organic light emitting diodes in an organic light emitting diode display according to an embodiment of the present invention.

Referring to FIG. 16A, the organic light emitting diode display according to an embodiment of the present invention comprises a plurality of scan lines SL arranged in parallel along the X-axis, and a plurality of data lines DL arranged in parallel along the Y-axis intersecting the X-axis. A plurality of first regions 10R, second regions 20R, and third regions 30R are formed by the crossings of the scan lines SL and the data lines DL. The first regions 10R, second regions 20R, and third regions 30R are alternately arranged in a matrix. Thin film transistors ST and DT to be connected to one sub-pixel are located in each of the first regions 10R, second regions 20R, and third regions 30R. The thin film transistors ST and DT may comprise at least one switching thin film transistor ST and a driving thin film transistor DT connected to the switching thin film transistor ST. The driving thin film transistor DT is connected to an organic light emitting diode.

Specifically, the driving thin film transistor DT is connected to a first electrode ANO via a pixel contact hole PH. The pixel contact hole PH is provided in each of the first regions 10R, second regions 20R, and third regions 30R. The arrangement of various wiring lines and thin film transistors of the organic light emitting diode display according to an embodiment of the present invention may be identical to that of the organic light emitting diode display according to the related art, except that the first electrode ANO is patterned into a different shape. Accordingly, the organic light emitting diode display according to an embodiment of the present invention can be manufactured with existing manufacturing facilities.

FIG. 16B is a view illustrating the positions of first electrodes and pixel contact holes for connecting the first electrodes and driving thin film transistors in an organic light emitting diode display according to an embodiment of the present invention.

Referring to FIG. 16B, each of the first electrodes ANO is connected to a driving thin film transistor via a pixel contact hole PH provided in each of the first regions 10R, second regions 20R, and third regions 30R. Each first electrode ANO may be patterned to correspond to the shape of a predetermined sub-pixel 10, 20, or 30. That is, the first electrodes ANO arranged in the first sub-pixel area 10, second sub-pixel area 20, and third sub-pixel area 30 may correspond to the shapes of the first, second, and third sub-pixels 10, 20, and 30, respectively. In this case, each first electrode ANO is connected to one of the pixel contact holes PH provided in the first regions 10R, second regions 20R, and third regions 30R. Thus, as illustrated in FIG. 16B, the first electrodes ANO have the shapes of corresponding sub-pixels, and may be extended and patterned in such a way as to be connected to the pixel contact holes PH. The extended and patterned parts LN of a first electrode ANO may be located in the spacing Lg between adjacent first electrodes ANO in such a way so as to not come into contact with these adjacent first electrodes ANO.

The spacing Lg between the adjacent first electrodes ANO adjacent to the extended and patterned parts LN of the first electrode ANO may be determined in consideration of, for example, short-circuits and decrease in aperture ratio. Banks BN for defining the first sub-pixel area 10, second sub-pixel area 20, and third sub-pixel area 30 are formed on the first electrodes ANO. The parts of the first electrodes ANO exposed by the banks BN may become luminous areas, and these luminous areas may correspond to the shapes of the first, second, and third sub-pixels 10, 20, and 30, respectively. The first and second sub-pixels 10 and 20 are located at least in the first and second areas 10R and 20R. The third sub-pixel 30 is located at least in the second area 20R and the third area 30R.

FIG. 16C is a superimposed view of FIGS. 16A and 16B schematically illustrating driving thin film transistors and organic light emitting diodes that are connected via pixel contact holes.

Figure 17:
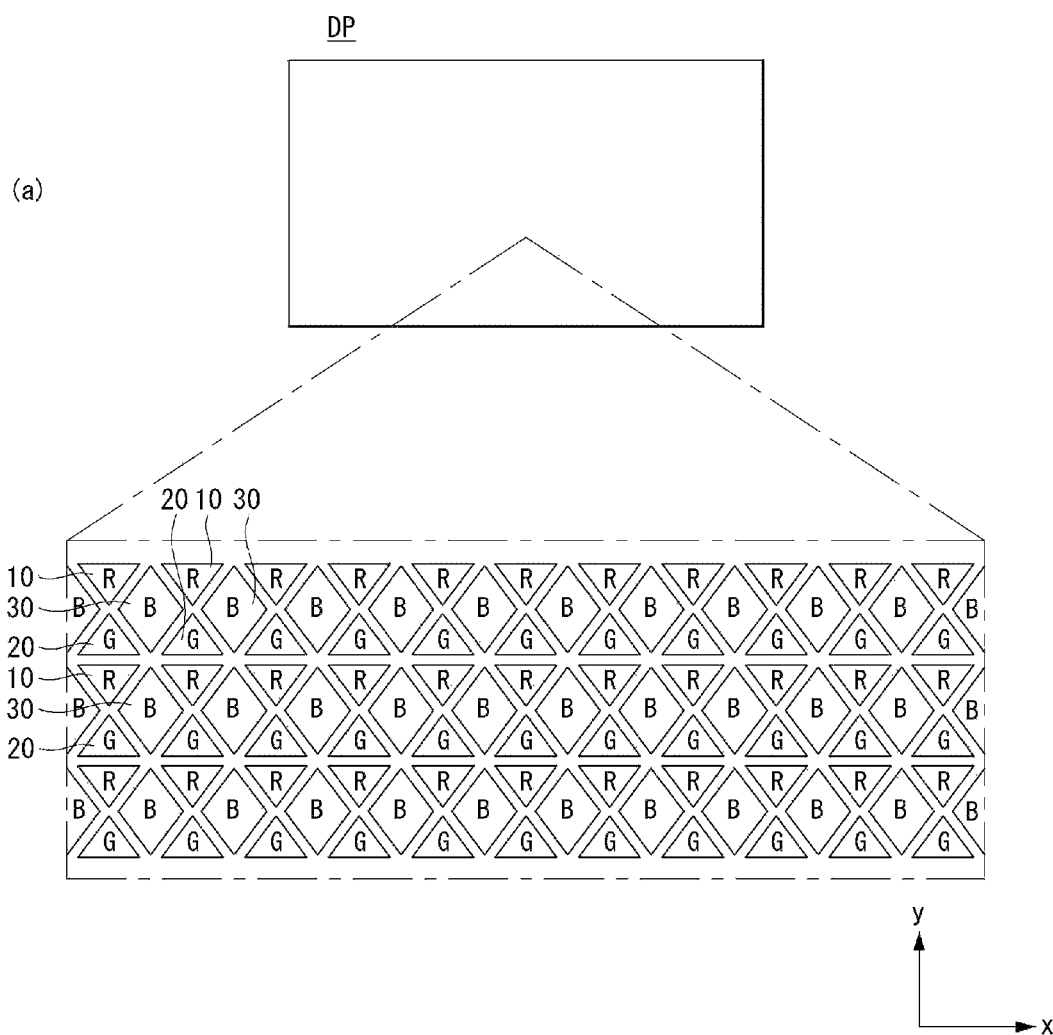
FIG. 17 is a view illustrating an exemplary arrangement of organic light emitting materials applied to sub-pixels according to an embodiment of the present invention.
Figure 17:
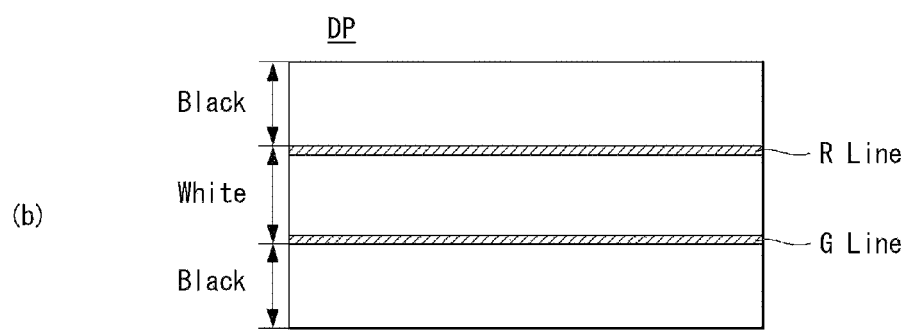
Figure 18:
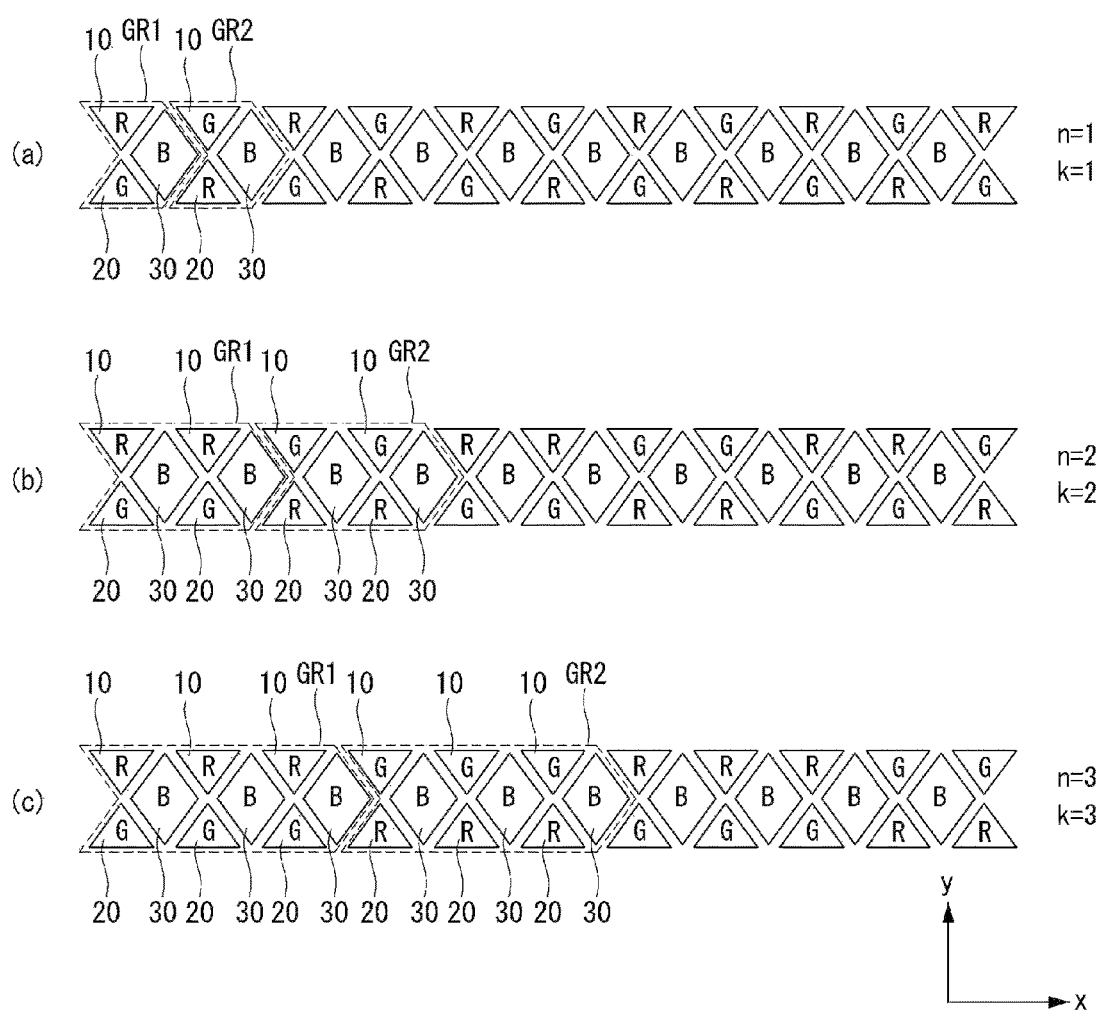
FIGS. 18 and 19 are views illustrating other exemplary arrangements of organic light emitting materials applied to sub-pixels according to an embodiment of the present invention.
Figure 19:
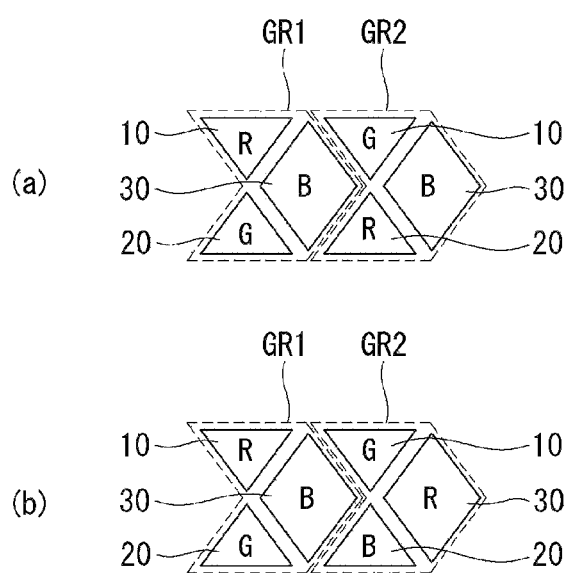

FIGS. 17 through 19 are views illustrating various exemplary arrangements of organic light emitting materials applied to sub-pixels according to embodiments of the present invention.

Referring to FIG. 17, a display panel DP comprises a plurality of pixels. Each pixel comprises a first sub-pixel 10, a second sub-pixel 20, and a third sub-pixel 30. The first sub-pixel 10 comprises a first color organic light emitting material. The second sub-pixel 20 comprises a second color organic light emitting material. The third sub-pixel 30 comprises a third color organic light emitting material. The first color is either red (R), green (G), or blue (B). The second color is either red (R), green (G), or blue (B), but except the first color. The third color is either red (R), green (G), or blue (B), but except the first and second colors.

The arrangement of colors for the organic light emitting materials applied to these sub-pixels may be the same for every pixel. For example, the organic light emitting material applied to the first sub-pixel 10 of each pixel may be red (R), the organic light emitting material applied to the second sub-pixel 20 of each pixel may be green (G), and the organic light emitting material applied to the third sub-pixel 30 of each pixel may be blue (B) (see (a) of FIG. 17).

Since the arrangement of organic light emitting materials is the same for every pixel, degradation in display quality caused by poor visibility may occur. For example, when a white color is displayed for an input image, the user may perceive red (R) and green (G) lines at top and bottom of the white display area, respectively. That is, since the red (R) organic light emitting material is applied to all the first sub-pixels 10, the user may perceive red (R) organic light emitting materials on a top of the white display area as a red (R) line extending in one direction. Likewise, since the green (G) organic light emitting material is applied to all the second sub-pixels 20, the user may perceive green (G) organic light emitting materials on a bottom of the white display area as a green (G) line extending in one direction (see (b) of FIG. 17).

To further improve display quality, the arrangement of organic light emitting materials of red (R), green (G), and blue (B) may be different between at least some neighboring pixels according to an exemplary embodiment of the present invention. In other words, the arrangement of colors R, G, and B for the organic light emitting materials applied to the respective sub-pixels may be different between at least some neighboring pixels.

That is, the pixels may comprise first and second pixels neighboring each other. The first sub-pixel 10 of the first pixel and the first sub-pixel 10 of the second pixel each may comprise an organic light emitting material of a different color. The second sub-pixel 20 of the first pixel and the second sub-pixel 20 of the second pixel each may comprise an organic light emitting material of a different color. The third sub-pixel 30 of the first pixel and the third sub-pixel 30 of the second pixel each may comprise an organic light emitting material of a different color. The first and second pixels may neighbor each other along the X-axis. The first and second pixels may neighbor each other along the Y-axis.

Referring to FIG. 18, the pixels may be divided into first pixel groups GR1 and second pixel groups GR2. Each first pixel group GR1 comprises n pixels (n is an integer greater than or equal to 1). Each second pixel group GR2 comprises k pixels (k is an integer greater than or equal to 1).

The arrangement of organic light emitting materials is different between the first pixel groups GR1 and the second pixel groups GR2. For example, the first sub-pixels 10, second sub-pixels 20, and third sub-pixels 30 included in the first pixel groups GR1 may comprise red, green, and blue organic light emitting materials, respectively. Likewise, the first sub-pixels 10, second sub-pixels 20, and third sub-pixels 30 included in the second pixel groups GR2 may comprise green, red, and blue organic light emitting materials, respectively. If each first pixel group GR1 comprises a plurality of pixels, the organic light emitting materials included in these pixels are arranged in a repeating pattern. If each second pixel group GR2 comprises a plurality of pixels, the organic light emitting materials included in these pixels are arranged in a repeating pattern.

If the value of n and/or k increases, the length of organic light emitting materials of identical colors arranged in a repeating pattern increases. Thus, an excessive increase in the values of n and k may result in degradation in display quality caused by poor visibility. Accordingly, the values of n and k can be properly selected so that lines of organic light emitting materials of identical colors are not visible to the user.

In FIG. 18, the n value and the k value are equal, but the present invention is not limited to this example. The n value and the k value may be different from each other. Also, in FIG. 18, the first pixel groups GR1 and the second pixel groups GR2 neighbor each other along the X-axis, but the present invention is not limited to this example. For example, the first pixel groups GR1 and the second pixel groups GR2 may neighbor each other along the Y-axis.

Referring to (A) of FIG. 19, the arrangement of colors for the organic light emitting materials applied to two of the first, second, and third sub-pixels 10, 20, and 30 may be different between neighboring pixel groups GR1 and GR2.

For example, the color of the organic light emitting material applied to the first sub-pixel 10 is different between the first pixel group GR1 and the second pixel group GR2. Likewise, the color of the organic light emitting material applied to the second sub-pixel 20 is different between the first pixel group GR1 and the second pixel group GR2. That is, the colors of the organic light emitting materials applied to the first, second, and third sub-pixels 10, 20, and 30 of the first pixel group GR1 may be red (R), green (G), and blue (B), respectively. In this case, the colors of the organic light emitting materials applied to the first, second, and third sub-pixels 10, 20, and 30 of the second pixel group GR2 may be green (G), red (R), and blue (B), respectively.

Referring to (B) of FIG. 19, the arrangement of colors for the organic light emitting materials applied to the first, second, and third sub-pixels 10, 20, and 30 may be different between neighboring pixel groups GR1 and GR2.

For example, the color of the organic light emitting material applied to the first sub-pixel 10 is different between the first pixel group GR1 and the second pixel group GR2.

Likewise, the color of the organic light emitting material applied to the second sub-pixel 20 is different between the first pixel group GR1 and the second pixel group GR2. Likewise, the color of the organic light emitting material applied to the third sub-pixel 30 is different between the first pixel group GR1 and the second pixel group GR2. That is, the colors of the organic light emitting materials applied to the first, second, and third sub-pixels 10, 20, and 30 of the first pixel group GR1 may be red (R), green (G), and blue (B), respectively. In this case, the colors of the organic light emitting materials applied to the first, second, and third sub-pixels 10, 20, and 30 of the second pixel group GR2 may be green (G), blue (B), and red (R), respectively.

As described above with reference to FIGS. 18 and 19, an organic light emitting diode display according to an embodiment of the present invention can improve display quality, as neighboring pixels each have a different arrangement of organic light emitting materials.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display comprising:
   a display panel having a display area that is defined with X and Y axes intersecting each other; and
   a plurality of pixels in the display panel, each comprising a first sub-pixel, a second sub-pixel and a third sub-pixel,
   wherein a shape of each of the first, second and third sub-pixels is defined by sides that are at a non-zero angle to the Y-axis or parallel to the X-axis, the first and second sub-pixels are substantially symmetrical to each other with respect to the X-axis, and the third sub-pixel is larger in size than the first and second sub-pixels,
   wherein the first sub-pixel has:
   a first side parallel to the X-axis;
   a second side bent and extended from one end of the first side; and
   a third side bent and extended from another end of the first side and connected to the second side, and
   wherein the third sub-pixel has:
   a fourth side parallel to one of the second and third sides adjacent thereto;
   a fifth side bent and extended from one end of the fourth side and substantially symmetrical to the fourth side with respect to the X-axis;
   a sixth side bent and extended from another end of the fourth side and parallel to the fifth side; and
   a seventh side connected to one end of the fifth side and one end of the sixth side and parallel to the fourth side;
   wherein one end of the fifth side is opposite to another end of fifth side that is connected to one end of fourth side, and
   wherein one end of the sixth side is opposite to another end of sixth side that is connected to another end of fourth side.

2. The organic light emitting diode display of claim 1, wherein an angle between the first side and the second side and an angle between the first side and the third side are equal.

3. The organic light emitting diode display of claim 1, wherein an acute angle between the fourth side and the X-axis ranges from 40° to 50°.

4. The organic light emitting diode display of claim 1, wherein one or more corners of one or more of the first, second and third sub-pixels is chamfered.

5. The organic light emitting diode display of claim 1, wherein each pixel comprises red, green, and blue sub-pixels, and the third sub-pixel is a blue sub-pixel.

6. The organic light emitting diode display of claim 1, further comprising a spacer disposed in an area between at least two of the first, second and third sub-pixels,
   wherein a shape of the spacer is defined by sides that are at an angle to the Y-axis or parallel to the X-axis.

7. An organic light emitting diode display comprising:
   a plurality of scan lines arranged along an X-axis;
   a plurality of data lines arranged along a Y-axis crossing the X-axis;
   first, second, and third regions arranged in a matrix defined by crossings of the scan lines and the data lines;
   thin film transistors arranged in the first, second and third regions;
   first electrodes connected to the thin film transistors via pixel contact holes; and
   banks on the first electrodes to define first, second, and third sub-pixels,
   wherein a shape of each of the first, second, and third sub-pixels is defined by sides that are at a non-zero angle to the Y-axis or parallel to the X-axis, the first and second sub-pixels are substantially symmetrical to each other with respect to the X-axis, and the third sub-pixel is larger in size than the first and second sub-pixels,
   wherein the first sub-pixel has:
   a first side parallel to the X-axis;
   a second side bent and extended from one end of the first side; and
   a third side bent and extended from another end of the first side and connected to the second side, and
   wherein the third sub-pixel has:
   a fourth side parallel to one of the second and third sides adjacent thereto;
   a fifth side bent and extended from one end of the fourth side and substantially symmetrical to the fourth side with respect to the X-axis;
   a sixth side bent and extended from another end of the fourth side and parallel to the fifth side; and
   a seventh side connected to one end of the fifth side and one end of the sixth side and parallel to the fourth side;
   wherein one end of the fifth side is opposite to another end of fifth side that is connected to one end of fourth side, and
   wherein one end of the sixth side is opposite to another end of sixth side that is connected to another end of fourth side.

8. The organic light emitting diode display of claim 7, wherein the first sub-pixel and the second sub-pixel are arranged at least in the first region and the second region, and the third sub-pixel is arranged at least in the second region and the third region.

9. The organic light emitting diode display of claim 7, wherein the pixel contact holes are provided in the first, second, and third regions, respectively.

10. The organic light emitting diode display of claim 7, wherein the first sub-pixel comprises a first color organic light emitting material, the second sub-pixel comprises a second color organic light emitting material, and the third sub-pixel comprises a third color organic light emitting material, wherein the first color is either red, green, or blue, the second color is either red, green, or blue, but except the first color, and the third color is either red, green, or blue, but except the first and second colors.

11. The organic light emitting diode display of claim 10, wherein the pixels comprise first and second pixels neighboring each other along either the X-axis or the Y-axis, wherein the first sub-pixel of the first pixel and the first sub-pixel of the second pixel each comprises an organic light emitting material of a different color.

12. The organic light emitting diode display of claim 10, wherein the pixels comprise first and second pixels neighboring each other along either the X-axis or the Y-axis, wherein the second sub-pixel of the first pixel and the second sub-pixel of the second pixel each comprises an organic light emitting material of a different color.

13. The organic light emitting diode display of claim 10, wherein the pixels comprise first and second pixels neighboring each other along either the X-axis or the Y-axis, wherein the third sub-pixel of the first pixel and the third sub-pixel of the second pixel each comprises an organic light emitting material of a different color.

14. The organic light emitting diode display of claim 7, wherein one or more corners of one or more of the first, second, and third sub-pixels are chamfered.

15. The organic light emitting diode display of claim 7, wherein each pixel comprises red, green, and blue sub-pixels, and the third sub-pixel is a blue sub-pixel.

16. The organic light emitting diode display of claim 7, further comprising a spacer disposed between at least two of the sub-pixels.

17. The organic light emitting diode display of claim 7, wherein the first, second, and third sub-pixels are arranged in a delta structure.

* * * * *